(12) United States Patent
Shimizu

(10) Patent No.: US 7,602,237 B2
(45) Date of Patent: Oct. 13, 2009

(54) AMPLIFYING CIRCUIT

(75) Inventor: Nobuyuki Shimizu, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 239 days.

(21) Appl. No.: 11/583,050

(22) Filed: Oct. 19, 2006

(65) Prior Publication Data
US 2007/0120597 A1 May 31, 2007

(30) Foreign Application Priority Data
Nov. 25, 2005 (JP) ............................. 2005-340120

(51) Int. Cl.
*H03F 1/14* (2006.01)
(52) U.S. Cl. ............................................ 330/51; 330/9
(58) Field of Classification Search .................. 330/51, 330/252; 381/94.5
See application file for complete search history.

(56) References Cited
U.S. PATENT DOCUMENTS
7,113,031 B2 * 9/2006 Rabary et al. .................. 330/51
7,164,312 B1 * 1/2007 Singh et al. ...................... 330/9
7,259,619 B2 * 8/2007 Chang et al. ................... 330/51

FOREIGN PATENT DOCUMENTS
JP 2004-88419 3/2004

* cited by examiner

*Primary Examiner*—Robert Pascal
*Assistant Examiner*—Hieu P Nguyen
(74) *Attorney, Agent, or Firm*—Volentine & Whitt, P.L.L.C.

(57) ABSTRACT

In an amplifying circuit, a first and a second switches are provided between an input terminal and output terminal of coupling capacitor and amplifier, and these switches are set in OFF state in a power-down state, and the second switch is turned on for a specified period when changed over to ordinary operation, and the capacitor is charged to a bias voltage corresponding to direct-current operating point, and then the second switch is turned off, and the first switch is turned on, and the mode is shifted to the ordinary operating state. Therefore, in a power-down state, a popping noise can be suppressed without resort to a charger for preliminarily charging the capacitor in a power-down state, and increase of current consumption due to charger is eliminated.

1 Claim, 4 Drawing Sheets

F I G. 1
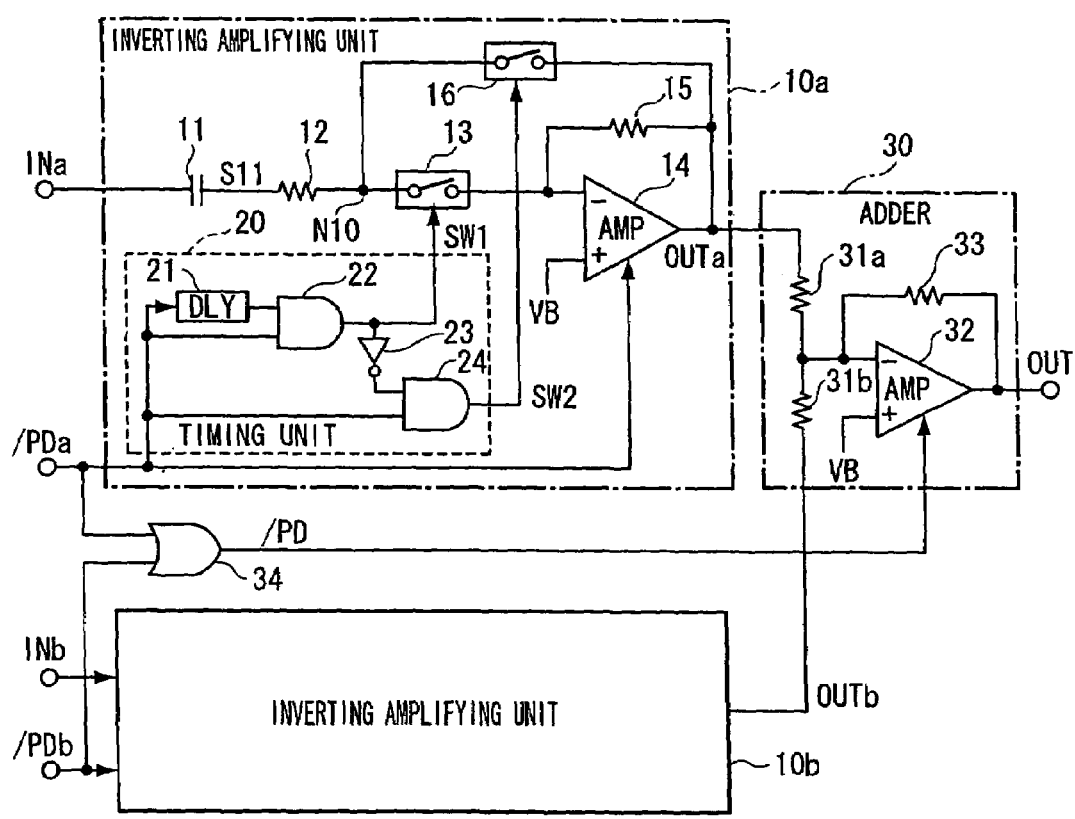

AMPLIFYING CIRCUIT

CROSS-REFERENCE TO RELATED APPLICATION

This application claims priority under 35 USC 119 from Japanese Patent Application No. 2005-340120, the disclosure of which is incorporated by reference herein.

BACKGROUND OF THE INVENTION

1. Field of the Invention

The invention relates to an amplifying circuit for audio signal, and more particularly to a technology for preventing a popping noise.

2. Description of the Related Art

In an amplifying circuit for audio signal, when sending/receiving signals between plural circuits having different direct-current operating points, a capacitor is generally inserted in the signal route to achieve alternating-current coupling so as to remove the direct-current components.

In alternating-current coupling, however, when the direct-current operating point is changed due to change in operating state of circuit, potential difference between terminals of coupling capacitor is changed, and a charging and discharging current, not a desired audio signal, flows. For example, in a appliance reduced in power consumption, in a mute state free from audio signal, the amplifying circuit is turned off, and when an audio signal is supplied, the amplifying circuit is returned to operating state. In such a case, since the direct-current operating point is changed, "popping" noise may be heard.

FIG. 2 is a block diagram of a conventional amplifying circuit incorporating a popping noise countermeasure.

This amplifying circuit includes an inverting amplifying unit 50a for amplifying an input signal INa, an inverting amplifying unit 50b for amplifying an input signal INb, an adder 60 for adding the output signals of these inverting amplifying units 50a, 50b, and outputting as an output signal OUT, and a charger 70.

The inverting amplifying units 50a, 50b are similar in structure, and the inverting amplifying unit 50a has a coupling capacitor 51 receiving the input signal INa at one end, and the other end of the capacitor 51 is connected to a node N50. The node N50 is connected to inverting input terminal of amplifier (AMP) 54 through resistor 52 and switch 53. A bias voltage VB corresponding to the direct-current operating point in an ordinary operating state is given to non-inverting input terminal of the amplifier 54, and the output terminal of the amplifier 54 is connected to inverting input terminal through resistor 55.

The node N50 of inverting amplifying unit 50a is further connected to the charger 70 through switch 56 and resistor 57. The charger 70 is composed of a voltage follower circuit, and by buffering the bias voltage VB at low impedance, the current flowing in the resistor 57 is prevented from interfering the bias voltage VB or other inverting amplifying unit.

The amplifier 54 is designed to change over the operating state depending on power-down signal/PDa. That is, when the power-down signal/PDa is at L level, the amplifier 54 is in a power-down state and does not amplify and saves current consumption, and the power-down signal/PDa is at H level, it returns to the ordinary operating state.

The power-down signal/PDa is also used in control of switches 53, 56. The switches 53, 56 are turned on when control signal is H, and turned off when L. The switch 53 receives power-down signal/PDa as control signal, and the switch 56 receives power-down signal/PDa inverted by inverter 58 as control signal.

The adder 60 sums output signal OUTa of inverting amplifying unit 50a and output signal OUTb of inverting amplifying unit 50b, and has resistors 61a, 61b for receiving these output signals OUTa, OUTb at one end. The other ends of resistors 61a, 61b are connected to inverting input terminal of an amplifier 62, and bias voltage VB is applied to non-inverting input terminal of the amplifier 62. Output terminal of the amplifier 62 is connected to inverting input terminal through resistor 63, and output signal OUT is output from this output terminal.

The amplifier 62, like the amplifier 54 is of a configuration that can change over the operating state depending on power-down signal/PD. The power-down signal/PD is generated by the logical sum of the power-down signals/PDa, and /PDb at an OR gate 64. That is, when both inverting amplifying units 50a, 50b are in power-down states, the adder 60 is also set to be in a power-down state.

Explanation will be given of the start amplification of input signal INa by the inverting amplifying unit 50a from a condition where the inverting amplifying unit 50b is amplifying only the input signal INb.

When the inverting amplifying unit 50a is in a power-down state, the power-down signal/PDa is at L level. Therefore, the switch 53 is OFF, the switch 56 is ON, and the amplifier 54 is in a power-down state. Hence, the node N50 of inverting amplifying unit 50a and input side of amplifier 54 are disconnected. On the other hand, the node N50 is receiving bias voltage VB from the charger 70 through resistor 57 and switch 56. Hence, the potential of the node N50 is equal to the bias voltage VB. The inverting input terminal of amplifier 54 is connected to the output terminal of this amplifier 54 through resistor 55, and this output terminal is further connected to the adder 60, and hence the potential at this inverting input terminal is equal to the direct-current operating point in an ordinary operating state, that is, bias voltage VB.

When the power-down signal/PDa is changed to H level, the switch 53 is ON, the switch 56 is OFF, and the amplifier 54 is changed to the ordinary operating state. Hence, the node N50 is disconnected from the charger 70, and is connected to the inverting input terminal of amplifier 54 through resistor 52 and switch 53. At this time, the potentials of node N50 and inverting input terminal of amplifier 54 are both equal to the bias voltage VB. Therefore, the potential of inverting input terminal of amplifier 54 is not changed, and a popping noise is not generated.

Japanese Patent Application Laid-Open (JP-A) No. 2004-88419 discloses an amplifying circuit including a switching element connected between input signal line and power source, output circuit control means for controlling the output transistor depending on the voltage in the input signal line, and a delay control circuit for executing control of output transistor by output circuit control means by delaying the time depending on the time constant when switching terminal turn-off signal is given to the control terminal.

In the amplifying circuit, however, since the charger 70 must be always kept in the operating state, there is the problem that the current consumption increases. When having plural inverting amplifying units 50, if the output impedance of charger 70 is high, interference may occur between input signals IN. To suppress interference, a buffer may be inserted in every input, but this leads to other problems such as increase of circuit and increase of current consumption. Further, due to an offset voltage of the amplifying circuit and the buffer, a difference is generated between the operating point at times of ordinary operation and the potential generated by the charger 70, and a voltage change due to the difference appears when changing over, and a popping noise may be caused.

It is hence an object of the invention to suppress a popping noise in a simple circuit configuration.

SUMMARY OF THE INVENTION

The amplifying circuit of the invention comprises: an amplifier including a first input terminal for receiving a signal to be amplified, a second input terminal for receiving a direct-current operating potential, an output terminal for outputting an amplified signal, and a control terminal for receiving a control signal for specifying the operation mode of a power-down state or an amplifying state; a capacitor for alternating-current coupling connected between an input node for receiving an input signal and a first internal node; a first resistor connected between the first internal node and a second internal node; a first switch connected between the second internal node and the first input terminal of the amplifier, for turning off when the power-down state is specified by the control signal, and when the amplifying state is specified turning on after a specified delay period; a second resistor connected between the output terminal of the amplifier and the first input terminal; and a second switch connected between the output terminal of the amplifier and the second internal node, for turning on for the specified delay period when the amplifying state is specified by the control signal, and turning off at other times.

The invention includes a first switch for turning on or off between a second internal node for applying an input signal to an amplifier having two operation modes of a power-down state and an amplifying state through a capacitor for alternating-current coupling and a first resistor and an input terminal of this amplifier, and a second switch for turning on or off between the second internal node and an output terminal of this amplifier, and when the power-down state is canceled, the second switch is turned on for a specific time, and then the second switch is turned off and the first switch is turned on.

Accordingly, while the second switch is turned on, the capacitor is charged, and the second internal node is charged up to the direct-current operating potential. Therefore, when the first switch is turned on and amplifying operation is started, a popping noise is not generated.

BRIEF DESCRIPTION OF THE DRAWINGS

Preferred exemplary embodiments of the present invention will be described in detail based on the following figures, wherein:

FIG. 1 is block diagram of amplifying circuit in embodiment 1 of the invention;

DETAILED DESCRIPTION OF THE INVENTION

Figure 2:
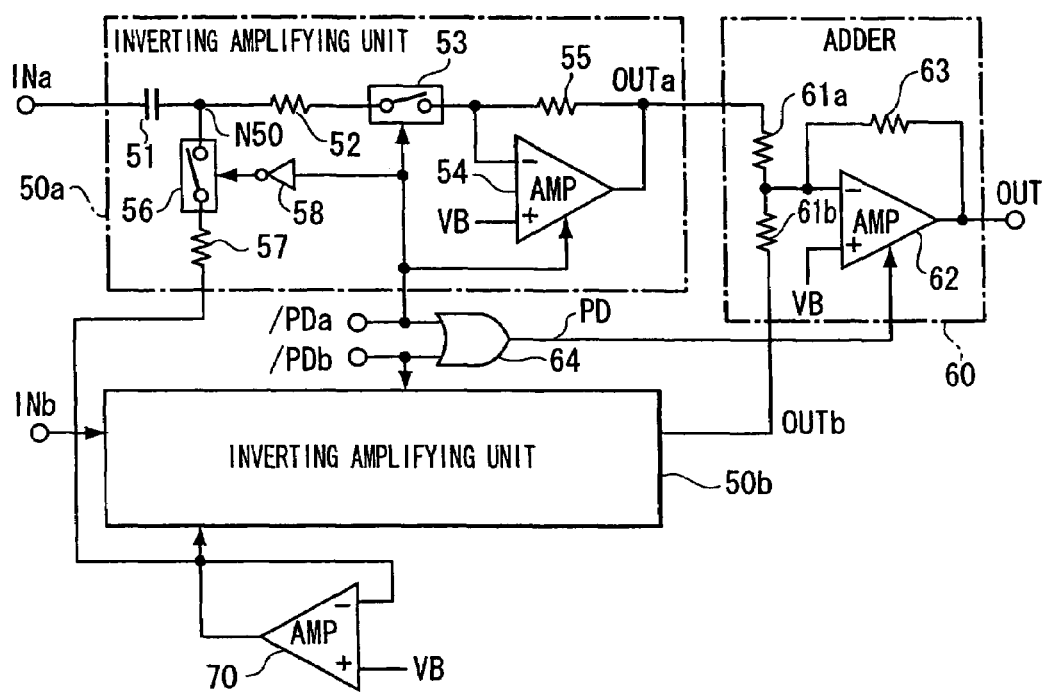
FIG. 2 is a block diagram of a conventional amplifying circuit.

Using an amplifier having three operation modes, a power-down state, an ordinary output state, and a high output state, when the power-down state is canceled, the high output state is specified for a specific time, and the second switch connected between the output terminal of the amplifier and the first internal node through third resistor is turned on. As a result, the capacitor for alternating-current coupling is quickly charged, and the first internal node is immediately set at direct-current operating potential. Afterwards, the ordinary output state is specified, and the second switch is turned off, and the first switch is turned on. Thus, the amplifying operation can be started without causing a popping noise in a short waiting time.

Embodiment 1

FIG. 1 is a block diagram of amplifying circuit in embodiment 1 of the invention.

This amplifying circuit includes an inverting amplifying unit 10a for amplifying an input signal INa, an inverting amplifying unit 10b for amplifying an input signal INb, and an adder 30 for adding the output signals OUTa, OUTb of these inverting amplifying units 10a, 10b, and outputting as an output signal OUT.

The inverting amplifying units 10a, 10b are similar in structure, and the inverting amplifying unit 10a has a coupling capacitor 11 receiving the input signal INa at one end, and other end of the capacitor 11 is connected to a node N10 through resistor 12. The node N10 is connected to inverting input terminal of an amplifier 14 through a switch 13. A bias voltage VB corresponding to the direct-current operating point in an ordinary operating state is given to non-inverting input terminal of the amplifier 14. The output terminal of the amplifier 14 is connected to inverting input terminal through resistor 15, and also to the node N10 through a switch 16.

The amplifier 14 is designed to change over the operating state depending on power-down signal/PDa. That is, when the power-down signal/PDa is at L level, the amplifier 14 is in a power-down state and does not amplify and saves current consumption, and the power-down signal/PDa is at H level, it returns to ordinary operating state.

The inverting amplifying unit 10a includes a timing unit 20 for generating control signals SW1, SW2 corresponding to switches 13, 16 on the basis of power-down signal/PDa. The timing unit 20 generates control signal SW2 for turning on the power switch 16 for a specified time when the power-down state is canceled and power-down signal/PDa is changed from L to H, and generates control signal SW1 for turning on the switch 13 after the specified time.

The timing unit 20 includes a delay element (DLY) 21 for delaying the power-down signal/PDa by a specified time, an AND gate 22 for outputting the AND of output of delay element 21 and power-down signal/PDa, and an AND gate 24 for outputting the AND of control signal SW1 inverted by inverter 23 and power down signal/PDa as control signal SW2.

The adder 30 sums output signal OUTa of inverting amplifying unit 10a and output signal OUTb of inverting amplifying unit 10b, and has resistors 31a, 31b for receiving these output signals OUTa, OUTb at one end. Other end of resistors 31a, 31b is connected to inverting input terminal of an amplifier 32, and bias voltage VB is applied to non-inverting input terminal of the amplifier 32. Output terminal of the amplifier 32 is connected to inverting input terminal through resistor 33, and output signal OUT is output from this output terminal.

The amplifier 32, like the amplifier 14, is a configuration that can change over the operating state depending on power-down signal/PD. The power-down signal/PD is generated by the logical sum of the power-down signals/PDa, and /PDb at an OR gate 34. That is, when both inverting amplifying units 10a, 10b are in power-down states, the adder 30 is also set to be in a power-down state.

Figure 3:
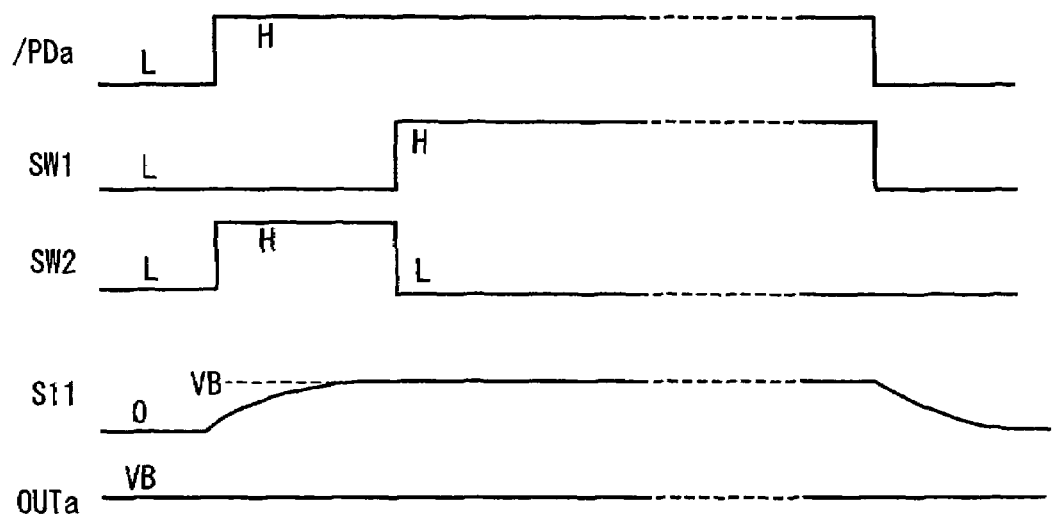
FIG. 3 is a signal waveform diagram showing the operation in FIG. 1.

FIG. 3 is a waveform diagram showing the operation in FIG. 1. Referring to FIG. 3, the operation in FIG. 1 is explained below.

While the inverting amplifying unit 10b is amplifying only input signal INb, suppose the inverting amplifying unit 10a starts amplification of input signal INa.

When the inverting amplifying unit 10a is in a power-down state, the power-down signal/PDa is at L level. Therefore, the control signals SW1, SW2 are both at L level, and switches 13, 16 are OFF. As a result, the amplifier 14 is in a power-down state. However, the inverting input terminal of the amplifier 14 is connected to the output terminal of the amplifier 14 through resistor 15, and this output terminal is further connected to the adder 30. Hence, the potential at this inverting input terminal of the amplifier 14 is equal to the direct-current operating point in the ordinary operating state, that is, bias voltage VB.

On the other hand, potential at other end of capacitor 11 appears on the node N10, and signal S10 of the node N10 is the sum of potential of input signal INa and voltage charged in the capacitor 11. Therefore, supposing the input signal INa to be 0 V and the capacitor 11 to be discharged completely, the signal S10 is 0 V.

When the power-down signal/PDa is changed to H level, the control signal SW2 is at H and the switch 16 is ON. The amplifier 14 is changed to the ordinary operating state. The switch 13 is OFF. Hence, the inverting input terminal of the amplifier 14 is connected to the output terminal through resistor 15, thereby composing a so-called voltage follower structure, and output signal OUTa becomes bias voltage VB. At the same time, output signal OUTa is applied to the capacitor 11 through switch 16 and resistor 12. Along with passing of the time, potential S11 at other end of capacitor 11 is charged up to bias voltage VB. At this time, when the output impedance of the amplifier 14 is low, fluctuation of output signal OUTa by charging current is small, and the level is suppressed so as not to be detected as a popping noise.

In a specified time after the power-down signal/PDa is changed to H, when potential S11 at other end of capacitor 11 nearly coincides with bias voltage VB, the control signal SW1 becomes H and the control signal SW2 returns to L. As a result, the switch 16 is turned off, and the switch 13 is turned on, and the inverting amplifying unit 10a returns to the ordinary operating state. At this time, since the potential of node N10 is nearly bias voltage VB, the potential of inverting input terminal of the amplifier 14 is not changed, and a popping noise is not generated.

When the power-down signal/PDa becomes L, the control signals SW1, SW2 are both L, and the switches 13, 16 are OFF, and the amplifier 14 is shifted to a power-down state.

Thus, in the amplifying circuit in embodiment, switches 13 and 16 are provided between the input terminal and output terminal of coupling capacitor 11 and amplifier 14, and these switches 13, 16 are set in OFF state in a power-down state, and the switch 16 is turned on for a specified time when changed over to ordinary operation, and the capacitor 11 is charged to bias voltage VB corresponding to direct-current operating point, and then the switch 16 is turned off, and the switch 13 is turned on, and the mode is shifted to the ordinary operating state. Therefore, in a power-down state, a popping noise can be suppressed without resort to a charger for preliminarily charging the capacitor 11 in a power-down state, and increase of current consumption due to charger is eliminated.

Besides, ordinary amplifying operation and charging of capacitor 11 are realized by one amplifier 14, and it is free from fluctuation of output level due to offset potential difference occurring at the time of generation of charging potential by other amplifier (for example, charger 70 shown in FIG. 2).

Embodiment 2

Figure 4:
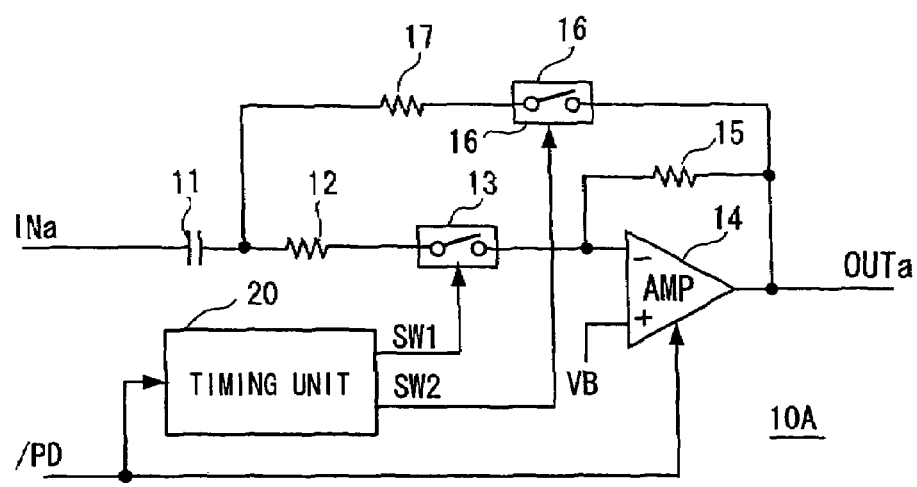
FIG. 4 is a block diagram of inverting amplifying unit showing embodiment 2 of the invention.

FIG. 4 is a block diagram of inverting amplifying unit in embodiment 2 of the invention.

This inverting amplifying unit 10A replaces inverting amplifying units 10a, 10b in FIG. 1, and same parts and elements as in FIG. 1 are identified with same reference numerals.

In the inverting amplifying unit 10A, one end of switch 16 is connected to output terminal of amplifier 14, and the other end of the switch 16 is connected to the junction of capacitor 11 and resistor 12 through resistor 17. Other constitution is same as in inverting amplifying units 10a, 10b in FIG. 1.

Operation of inverting amplifying unit 10A is basically same as that of inverting amplifying unit 10a in FIG. 1. However, resistor 17 for determining the magnitude of charging current of capacitor 11 is provided aside from the resistor 12 for input for composing the inverting amplifying circuit. Therefore, the value of resistor 17 can be set to an arbitrary value, regardless of the value of resistor 12. Hence, the value of resistor 17 may be set as small as possible within a range not causing effect on output signal OUTa of amplifier 14 by charging current. Therefore, in addition to the merits of embodiment 1, it is possible to shorten the charging time, that is, the waiting time until changing over to ordinary operation after change of power-down signal/PDa to H level.

Embodiment 3

Figure 5:
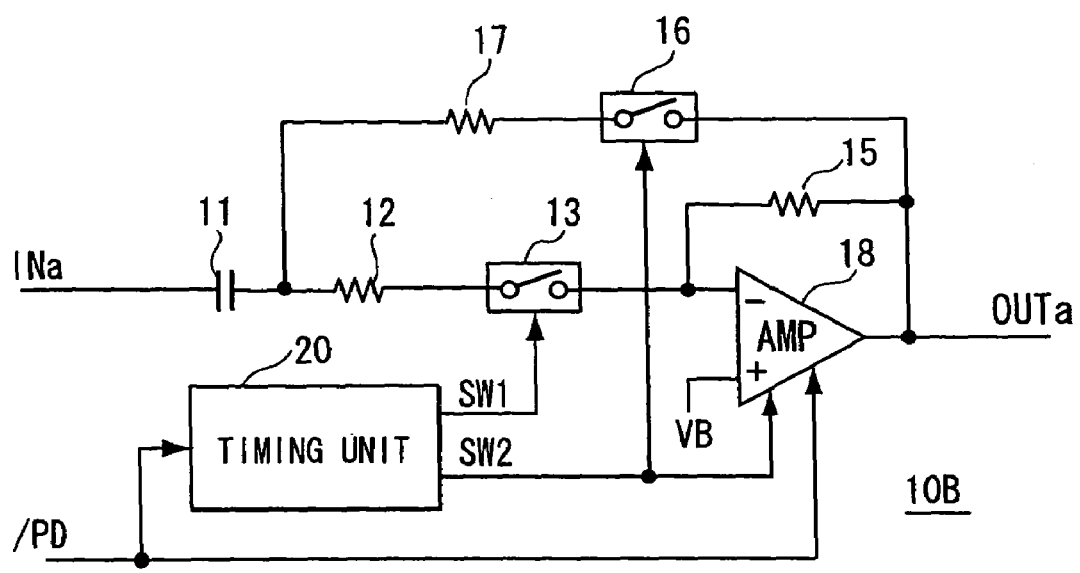
FIG. 5 is a block diagram of inverting amplifying unit showing embodiment 3 of the invention.

FIG. 5 is a block diagram of inverting amplifying unit in embodiment 3 of the invention.

This inverting amplifying unit 10B replaces inverting amplifying units 10a, 10b in FIG. 1, and same parts and elements as in FIG. 4 are identified with same reference numerals.

In the inverting amplifying unit 10B, an amplifier 18 capable of changing over the driving capacity is provided instead of the amplifier 14 in FIG. 4.

The amplifier 18 has sets of output stage transistors connected in parallel, in which two sets of output stage transistor are driven simultaneously when the high output state is specified by driving capacity changeover signal, and only one set of transistors is driven when the ordinary output state is specified. As driving capacity changeover signal, control signal SW2 is given. Other constitution is same as in FIG. 4.

Operation of inverting amplifying unit 10B is basically same as that of inverting amplifying unit 10A in FIG. 4. However, during charging time, that is, from change of power-down signal/PDa to H level until changed over to ordinary operation, when the control signal SW2 is H and the switch 16 is turned on, the driving capacity of the amplifier 18 is high output. Hence, the capacitor 11 can be charged in a much shorter time. When the control signal SW2 returns to L, the amplifier 18 returns to ordinary output and amplifies in ordinary operation.

The inverting amplifying unit 10B in embodiment 3 has the amplifier 18 for heightening the driving capacity during charging period and returning to ordinary capacity after termination of charging period. Therefore, it has an advantage that the waiting time for changing over to ordinary operation can be further shortened in addition to the merits of embodiment 1.

The invention is not limited to these embodiments alone, but may be changed and modified in various forms. Examples of modified forms include the following:

(1) The number of inverting amplifying unit 10 to be connected in parallel is not specified. If only one is used, the adder 30 is not needed.

(2) The circuit of timing unit 20 is an example, and is not specified as far as similar control signals SW1, SW2 can be output. Instead of forming the timing unit 20 in the inverting amplifying unit 10, it may be designed to apply control signals SW1, SW2 from outside.

(3) The resistor 17 to be connected in series to the switch 16 is not limited to an independent resistor element, and, for example, a transistor for composing the switch 16 or other ON resistor may be used.

What is claimed is:

1. An amplifying device comprising:
    a plurality of amplifying units; and
    an adder for receiving a plurality of output signals from respective ones of the plurality of amplifying units, summation processing the received plurality of signals, and outputting the summated signal,
    wherein each one of the plurality of amplifying units includes
    an amplifier including a first input terminal for receiving a signal to be amplified, a second input terminal for receiving a direct-current operating potential, an output terminal for outputting an amplified signal, and a control terminal for receiving a control signal for specifying an operation mode of a power-down state or an amplifying state,
    a capacitor for alternating-current coupling connected between an input node for receiving an input signal and a first internal node,
    a first resistor connected between the first internal node and a second internal node,
    a first switch connected between the second internal node and the first input terminal of the amplifier, for turning off when the power-down state is specified by the control signal, and when the amplifying state is specified turning on after a specified delay period,
    a second resistor connected between the output terminal of the amplifier and the first input terminal, and
    a second switch connected between the output terminal of the amplifier and the second internal node, for turning on for the specified delay period when the amplifying state is specified by the control signal, and turning off at other times.

* * * * *